(12) United States Patent
Huang et al.

(10) Patent No.: US 8,927,058 B2
(45) Date of Patent: Jan. 6, 2015

(54) PHOTORESIST COATING PROCESS

(75) Inventors: Shou-Wan Huang, Hsinchu (TW); Kuan-Hua Su, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 1392 days.

(21) Appl. No.: 12/168,297

(22) Filed: Jul. 7, 2008

(65) Prior Publication Data

US 2010/0003403 A1    Jan. 7, 2010

(51) Int. Cl.
*B05D 3/12* (2006.01)
*G03F 7/16* (2006.01)

(52) U.S. Cl.
CPC .................. *G03F 7/162* (2013.01)
USPC ............ 427/240; 427/425; 118/52; 118/320; 438/780; 438/782

(58) Field of Classification Search
USPC ............ 427/240, 299, 331, 425; 118/52, 54, 118/320; 438/780, 782
See application file for complete search history.

(56) References Cited

U.S. PATENT DOCUMENTS

| | | | | |
|---|---|---|---|---|
| 4,732,785 A | * | 3/1988 | Brewer | 438/748 |
| 5,405,813 A | | 4/1995 | Rodrigues | |
| 5,677,001 A | * | 10/1997 | Wang et al. | 427/240 |
| 5,837,319 A | * | 11/1998 | Walters et al. | 427/240 |
| 5,968,592 A | * | 10/1999 | Yoshida et al. | 438/758 |
| 2004/0052956 A1 | * | 3/2004 | Courtenay | 427/421 |
| 2004/0076749 A1 | * | 4/2004 | Lee et al. | 427/240 |
| 2004/0180141 A1 | * | 9/2004 | Kobayashi et al. | 427/240 |
| 2005/0026455 A1 | * | 2/2005 | Hamada et al. | 438/782 |
| 2006/0223336 A1 | * | 10/2006 | Wei | 438/782 |
| 2007/0254099 A1 | * | 11/2007 | Yoshihara et al. | 427/240 |
| 2008/0069948 A1 | * | 3/2008 | Yoshihara et al. | 427/240 |

* cited by examiner

*Primary Examiner* — Kirsten Jolley
(74) *Attorney, Agent, or Firm* — Winston Hsu; Scott Margo

(57) ABSTRACT

A photoresist coating process including a first step and a second step is provided. In the first step, a wafer is accelerated by a first average acceleration. In the second step, the wafer is accelerated by a second average acceleration. The first acceleration and the second acceleration are both larger than zero, and photoresist material is provided to the wafer only in the second step.

9 Claims, 2 Drawing Sheets

PHOTORESIST COATING PROCESS

BACKGROUND OF THE INVENTION

1. Field of Invention

The present invention relates to a semiconductor process. More particularly, the present invention relates to photoresist coating process.

2. Description of Related Art

Generally speaking, a fabrication process of a semiconductor device, which includes thin film deposition, photolithograph, etching, ion implantation and thermal process, etc., is complicated, and the photolithography process is the most essential step in the entire semiconductor process. A photolithograph process constitutes mainly with the three steps of photoresist coating, exposure and development.

The conventional photoresisting coating process includes three major parts. Firstly, a wafer is placed on a platform of a spinner and is then rotated at high speed to remove the dust from the surface of the wafer. Thereafter, a photoresist material is provided to the surface of the wafer, and by controlling the rotational speed of the wafer, the photoresist material is evenly coated on the wafer to form a photoresist layer. After this, the supply of the photoresist material layer is terminated and the thickness of the photoresist layer is adjusted by controlling the rotational speed of the wafer.

The even coating of the photoresist material for fully covering the wafer strongly influences the accuracy of the pattern transfer. However, the conventional practice often results with an uneven coating of the photoresist material and an incomplete coverage of the wafer with the photoresist material, or an excessive coating of the photoresist material to fully cover the wafer. As a result, the chances of affecting the accuracy of pattern transfer or the production cost greatly increase. Moreover, the conventional approach often results with a lavish consumption of the photoresist material and high production cost.

SUMMARY OF THE INVENTION

The present invention is to provide a photoresist coating process, wherein the photoresist material evenly covers the entire wafer surface and the consumption of the photoresist material is reduced.

The present invention is to provide a photoresist coating process that includes performing a first step and a second step. In the first step, the wafer is rotated with a first average acceleration. In the second step, the wafer is rotated with a second average acceleration. The first average acceleration and the second average acceleration are greater than zero, and only in the second step, the photoresist material is supplied to the wafer.

In accordance to an embodiment of the present invention, the second step includes a multi-stage acceleration step to rotate the wafer.

In accordance to an embodiment of the present invention, each stage of the multi-stage acceleration step includes accelerating the rotation of the wafer and rotating the wafer at a constant angular velocity.

In accordance to an embodiment of the present invention, the second average acceleration is lower than the first average acceleration.

In accordance to an embodiment of the present invention, the photoresist coating method further includes performing a velocity adjustment step to evenly distribute the photoresist material on the wafer.

In accordance to an embodiment of the present invention, the above velocity adjustment step further includes repeatedly accelerating and decelerating the rotation of the wafer.

In accordance to an embodiment of the present invention, the velocity in the velocity adjustment step exhibits a damped sinusoidal wave.

In accordance to an embodiment of the present invention, wherein the photoresist coating method further includes a step of maintaining the wafer at a steady rotation between the steps of accelerating and decelerating the rotation of the wafer.

In accordance to an embodiment of the present invention, wherein the velocity in the velocity adjustment step exhibits a pulse wave.

In accordance to an embodiment of the present invention, wherein a velocity range of the above velocity adjustment step ranges from greater than 0 and less than the final velocity of the second step.

In accordance to an embodiment of the present invention, the velocity range in the above velocity adjustment step is within the velocity range of the second step.

In accordance to an embodiment of the present invention, the first step is a pre-wet step, wherein a solvent is applied to the wafer to wet the wafer.

In accordance to an embodiment of the present invention, the above photoresist coating process further includes performing an initial step prior to the first step, in which no material is applied for the wafer to rotate at a constant angular velocity.

In accordance to an embodiment of the present invention, the velocity of the initial step is greater than 0 and is smaller than the final velocity of the first step.

The present invention also provides a photoresist coating process that includes the following steps. A photoresist material is first applied to a rotating wafer. Then, a velocity adjustment step is performed to evenly distribute the photoresist material on the wafer, wherein the velocity adjustment step includes repeatedly accelerating and decelerating the rotation of the wafer.

In accordance to an embodiment of the present invention, the velocity in the velocity adjustment step exhibits a damped sinusoidal wave.

In accordance to an embodiment of the present invention, wherein the velocity adjustment step further includes a step of maintaining the wafer at a steady rotation between the steps of accelerating and decelerating the rotation of the wafer.

In accordance to an embodiment of the present invention, wherein the velocity in the velocity adjustment step exhibits a pulse wave.

According to the photoresist coating process of the invention, the photoresist material is only provided in the second step by repeatedly accelerate and decelerate the rotation of the wafer to uniformly coat and cover the surface of the entire wafer. Hence, the consumption of photoresist material can be preserved to significantly reduce the production cost. Moreover, subsequent to the supply of the photoresist material, the method of repeatedly accelerating and decelerating the wafer is again applied to ensure a more uniform coating of the entire wafer surface. Hence, the photoresist layer has an appropriate uniform thickness and the subsequent pattern transfer process is facilitated.

In order to make the aforementioned and other objects, features and advantages of the present invention comprehensible, a preferred embodiment accompanied with figures is described in detail below.

DESCRIPTION OF EMBODIMENTS

The present invention provides a photoresist coating process that includes respectively performing a first step and a second step of rotating the wafer with an average acceleration, and only providing the photoresist material during the second step to uniformly coating and covering the wafer with the photoresist material to preserve the consumption of the photoresist material. Further, the present invention provides a photoresist coating process, when the photoresist material is applied to the rotating wafer, a velocity adjustment step is performed on the wafer to uniformly coat the photoresist material on the wafer. In the following embodiments, the above two photoresist coating processes are combined. However, the present invention is limited as such. The above two photoresist coating processes can be combined with other conventional photoresist coating processes.

Figure 1:
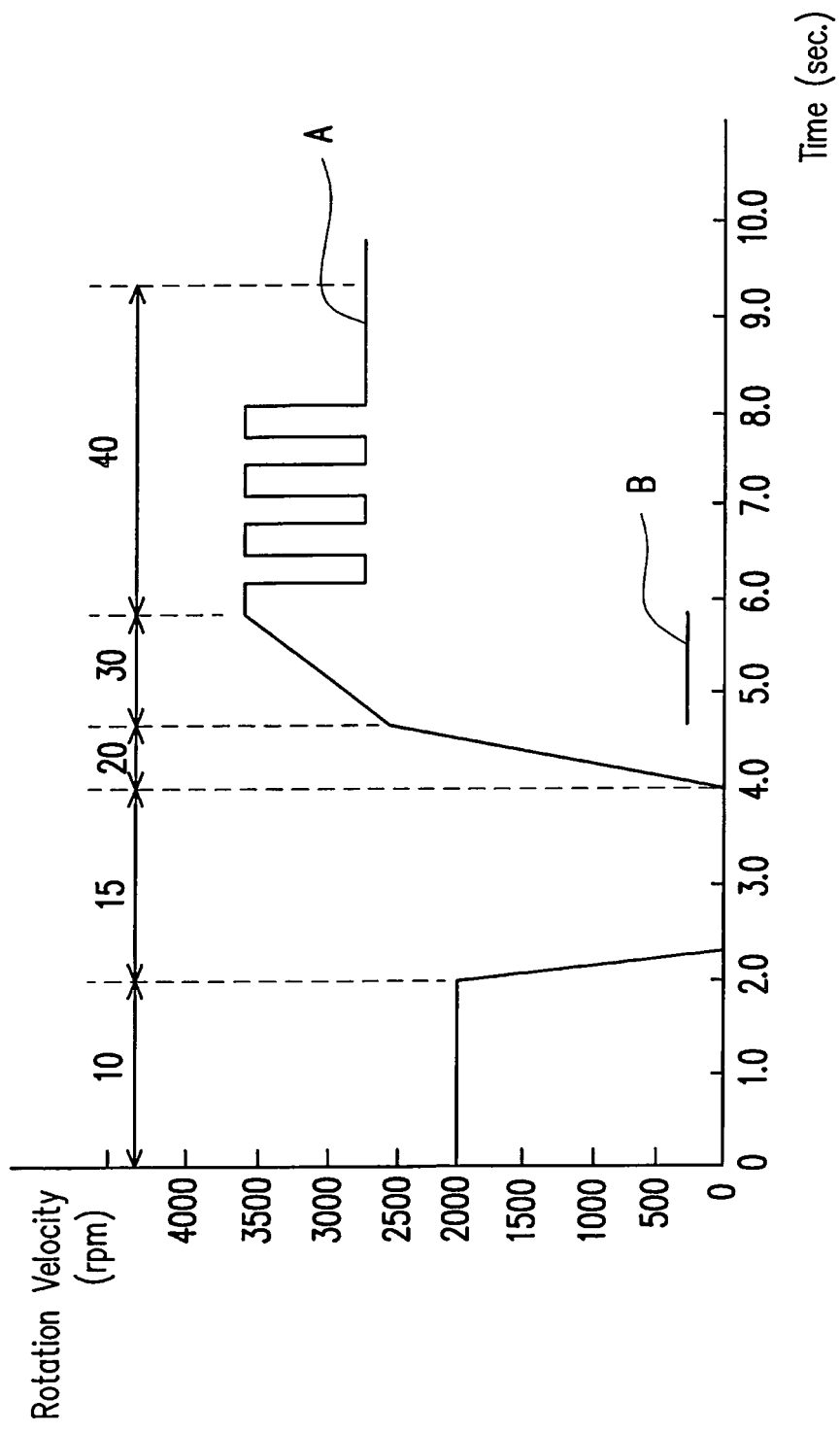
FIG. 1 is a diagram showing a relationship between the rotational velocity of the wafer and the rotational time of the wafer during a photoresist coating process of one embodiment of the invention.

FIG. 1 is a diagram showing a relationship between the rotational velocity of the wafer and the rotational time period of the wafer during a photoresist coating process of one embodiment of the invention. Curve A represents the rotational velocity of the wafer, while curve B represents the duration of which the photoresist material is being supplied.

A wafer is placed in a semiconductor apparatus. The wafer includes a substrate or a substrate having a material layer already formed thereon. The semiconductor apparatus includes a photoresist coating apparatus.

Referring to FIG. 1, an initial step 10 is performed, wherein no material is applied to the wafer and the wafer is rotated at a steady velocity. The initial step 10 can remove the dust and contaminants on the surface of the wafer to reduce the resistance on the surface of the wafer. Accordingly, the subsequent coating process of the photoresist material is facilitated. In an embodiment of the present invention, the wafer is rotated at a rate ranging from greater than 0 to less than 2000 rpm.

Then, a resting step 150 is performed, in which the rotational velocity of the wafer is reduced to 0 rmp and is maintained at 0 rpm for few seconds, for example, about 2 seconds. Similarly, during the resting step 150, no material is applied to the wafer.

Thereafter, a first step 20 is performed on the wafer, wherein the wafer is increased from 0 rpm to a sufficiently high final velocity by a first average rotational acceleration. For example, in the first step 20, the rotational velocity of the wafer increases from 0 rpm to 2500 rpm within 4 to 4.5 seconds. Similarly, in this first step 20, no photoresist material is applied to the wafer. In this embodiment of the invention, the first step 20 is, for example, a pre-wet step, which includes dispensing a solvent to the wafer while the wafer is rotating to wet the surface of the wafer. Accordingly, the adhesion of the wafer surface to the subsequently supplied photoresist material is enhanced. The solvent is, for example, a pre-wet solvent.

Subsequent to the first step 20, a second step 30 is performed on the wafer. In this invention, as indicated by segment B, the photoresist material is supplied to the wafer only in this step 30, and no photoresist material is supplied during other process step. The initial velocity in the second step 30 is substantially the same as the final velocity in the first step 20. Further, the wafer is rotated by a second average acceleration, wherein the second average acceleration is, for example, less than or equal to the first average acceleration. In the present invention, in the first step 20, for example, within 4.5 second to 6 second, the wafer is rotated from a velocity of about 2500 rpm to 3600 rpm. In this embodiment, the second step 30 is a multi-stage acceleration step for rotating the wafer, wherein each stage of the multi-stage acceleration step includes accelerating the rotation of the wafer and maintaining the wafer at a steady rotation. More particularly, the photoresist material is applied to the rotating wafer, and the wafer is repeatedly rotated at an accelerated velocity and a steady velocity for the photoresist material to evenly coat and cover the entire wafer surface. The photoresist material can be a positive photoresist or a negative photoresist.

Figure 2:
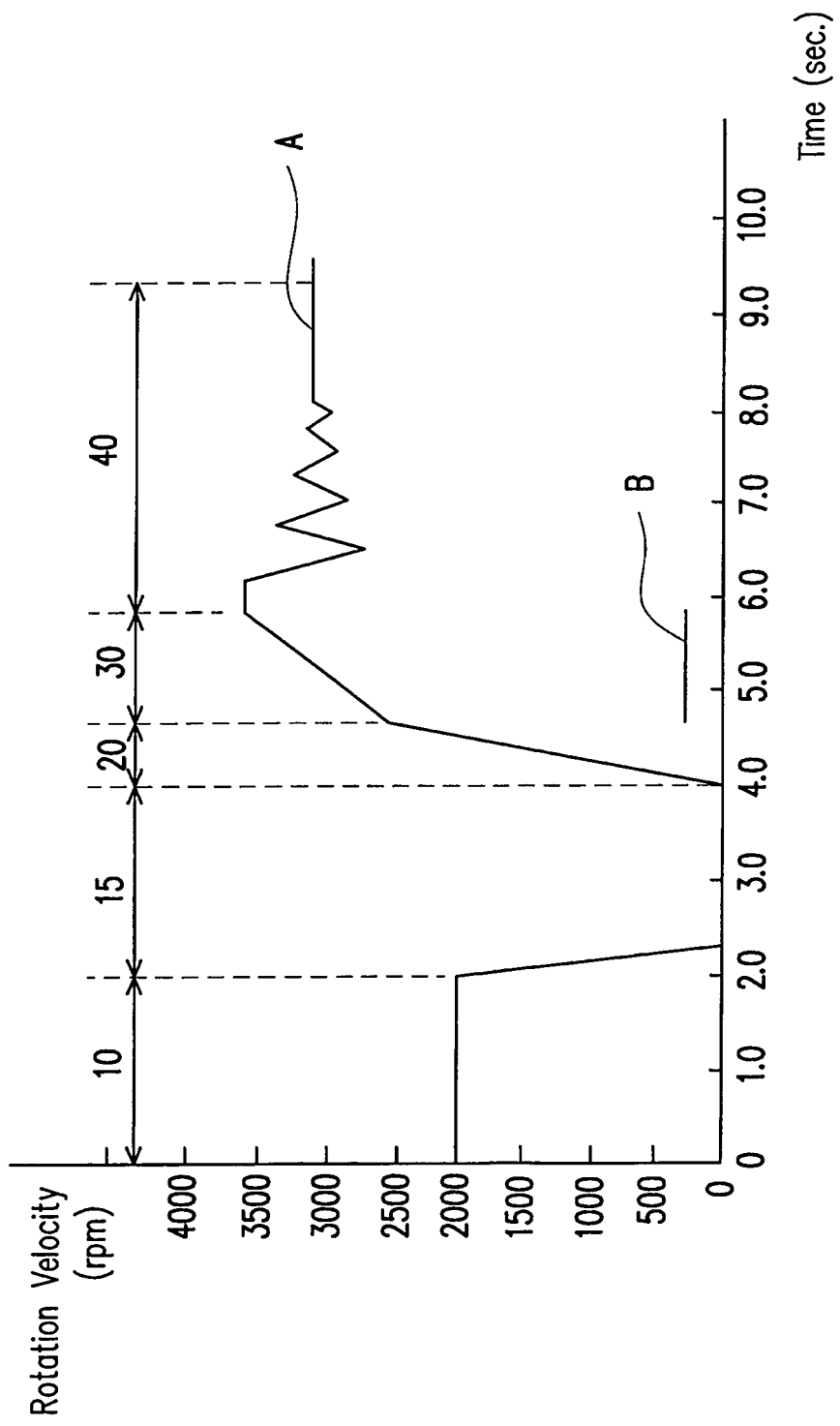
FIG. 2 is a diagram showing a relationship between the rotational velocity of the wafer and the rotational time of the wafer during a photoresist coating process of another embodiment of the invention.

In this embodiment of the invention, subsequent to the second step 30, the supply of the photoresist material is terminated, and a velocity adjustment step 40 is performed on the wafer in order for the photoresist material to be more evenly coated on the wafer. Accordingly, the photoresist layer has a uniform and appropriate thickness. The velocity range in the velocity adjustment step 40 is controlled to be greater than 0 and less than the final velocity in the second step 30. In this embodiment, the velocity range in the velocity adjustment step 40 is within the velocity range of the second step, for example, between 2700 rpm and 3600 rpm. In this embodiment, the velocity adjustment step 40 includes repeatedly accelerating the rotation of the wafer, maintaining a steady rotation of the wafer and decelerating the rotation of the wafer. For example, the velocity in the velocity adjustment step 40 exhibits a pulse wave. As shown in FIG. 1, in another embodiment, the velocity adjustment step 40 only includes repeatedly accelerating the rotation of the wafer and decelerating the rotation of the wafer. The velocity of the wafer in the velocity adjustment step 40 may also exhibits a damped sinusoidal wave, for example, as shown in FIG. 2.

In accordance to the present invention, the supply of the photoresist maternal is only provided in the second step of the photoresist coating process. Hence, the consumption of the photoresist material is greatly reduced to lower production cost. Moreover, when the photoresist material is supplied to the wafer, a multi-stage process is performed for accelerating the wafer in order for the photoresist material to cover the entire wafer surface and to be evenly distributed on the wafer. Moreover, the velocity adjustment step is performed subsequent to the termination of the supply of the photoresist material, and the photoresist material becomes more evenly distributed for the photoresist layer to have a uniform and appropriate thickness. Hence, the subsequent pattern transfer process is facilitated to improve the reliability of the device. Additionally, the existing photoresist coating apparatus can be applied to the photoresist coating process of the present invention, and the photoresist coating process of the present invention can be respectively incorporated with the existing photoresist processes. Accordingly, the increase of the manufacturing cost is mitigated.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A photoresist coating process, comprising:
performing a first step to rotate a wafer by a first average acceleration;
performing a second step to rotate the wafer by a second average acceleration; and
performing a velocity adjustment step to evenly distribute the photoresist material on the wafer, wherein the velocity adjustment step includes repeatedly decelerating the rotation of the wafer and accelerating the rotation of the wafer;
wherein the first average acceleration and the second average acceleration are greater than 0; a photoresist material is dispensed to the wafer only during the second step; the second average acceleration of the second step is smaller than the first average acceleration of the first step; and the velocity range of the velocity adjustment step is within the velocity range of the second step.

2. The process of claim 1, wherein the second step comprises a multi-stage acceleration step for rotating the wafer.

3. The process of claim 2, wherein the multi-stage acceleration step comprises a stage of accelerating the rotation of the wafer and a stage of maintaining the rotation of the wafer at a constant angular velocity.

4. The process of claim 1, wherein a velocity in the velocity adjustment step exhibits a damped sinusoidal wave.

5. The process of claim 1, wherein between the step of accelerating the rotation of the wafer and the step of decelerating the rotation of the wafer in the velocity adjustment step further comprises a step of a steady rotation of the wafer.

6. The process of the claim 5, wherein a velocity in the velocity adjustment step exhibits a pulsed wave.

7. The process of claim 1, wherein the first step is a pre-wet process and a solvent is applied to the rotating wafer to wet the wafer.

8. The process of claim 1 further comprises performing an initial step prior to the first step, in which no material is applied to the wafer while rotating the wafer at a constant angular velocity.

9. The process of claim 8, wherein a velocity in the initial step is greater than 0 and is less than a final velocity of the first step.

* * * * *